US012738894B2

(12) United States Patent
Khlat et al.

(10) Patent No.: US 12,738,894 B2
(45) Date of Patent: Sep. 15, 2026

(54) PROGRESSIVE ENVELOPE TRACKING WITH DELAY COMPENSATION

(71) Applicant: Qorvo US, Inc., Greensboro, NC (US)

(72) Inventors: Nadim Khlat, Cugnaux (FR); Mohammad Ahsanul Adeeb, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 509 days.

(21) Appl. No.: 18/252,361

(22) PCT Filed: Sep. 23, 2021

(86) PCT No.: PCT/US2021/051682
§ 371 (c)(1),
(2) Date: May 9, 2023

(87) PCT Pub. No.: WO2022/103493
PCT Pub. Date: May 19, 2022

(65) Prior Publication Data
US 2024/0007054 A1 Jan. 4, 2024

Related U.S. Application Data

(60) Provisional application No. 63/114,200, filed on Nov. 16, 2020.

(51) Int. Cl.
*H03F 1/02* (2006.01)
*H03F 3/195* (2006.01)
*H03F 3/24* (2006.01)

(52) U.S. Cl.
CPC ......... *H03F 1/0277* (2013.01); *H03F 1/0227* (2013.01); *H03F 3/195* (2013.01);
(Continued)

(58) Field of Classification Search
CPC ................ H03F 1/0277; H03F 1/0227; H03F 2200/102; H03F 2200/129;
(Continued)

(56) References Cited

U.S. PATENT DOCUMENTS 6,255,906 B1 * 7/2001 Eidson .................... H03F 3/602 330/149
9,379,667 B2 6/2016 Khlat et al.
(Continued)

FOREIGN PATENT DOCUMENTS

EP 2705604 B1 4/2020
GB 2510396 A * 8/2014 ........... H03F 1/0227
(Continued)

OTHER PUBLICATIONS

Office Action for Taiwanese Patent Application No. 110142531, mailed Aug. 6, 2025, 10 pages.
(Continued)

*Primary Examiner* — Andrea Lindgren Baltzell
*Assistant Examiner* — Lance Torbjorn Bartol
(74) *Attorney, Agent, or Firm* — Withrow & Terranova, P.L.L.C.

(57) ABSTRACT

A progressive envelope tracking (ET) with delay compensation includes an ET integrated circuit (IC) (ETIC) that is a progressive ETIC that switches between different driver amplifiers having different associated offset voltages based on a tracking signal (e.g., Vramp) from a baseband transceiver. To make sure that desired changes to the offset voltage occur contemporaneously with an input signal for the driver amplifiers, a delay may be added to the input signal for the driver amplifiers. By adding and controlling this delay to the input to the driver amplifiers, the changes
(Continued)

to the offset voltage will track the changes to the input signal at the driver amplifiers and overall efficiency of the ETIC may be improved.

18 Claims, 5 Drawing Sheets

(52) U.S. Cl.
CPC ....... *H03F 3/245* (2013.01); *H03F 2200/102* (2013.01); *H03F 2200/129* (2013.01); *H03F 2200/135* (2013.01); *H03F 2200/267* (2013.01); *H03F 2200/451* (2013.01); *H03F 2203/21106* (2013.01); *H03F 2203/21145* (2013.01)

(58) Field of Classification Search
CPC ......... H03F 2200/135; H03F 2200/267; H03F 2203/21106; H03F 2203/21145; H03F 3/195; H03F 2200/451; H03F 3/245
USPC ............................................................ 330/51
See application file for complete search history.

(56) References Cited

U.S. PATENT DOCUMENTS

| | | | | |
|---|---|---|---|---|
| 9,590,563 | B2 | 3/2017 | Wimpenny | |
| 9,595,869 | B2 | 3/2017 | Lerdworatawee | |
| 9,900,204 | B2 | 2/2018 | Levesque et al. | |
| 10,158,330 | B1 | 12/2018 | Khlat | |
| 11,018,627 | B2 | 5/2021 | Khlat | |
| 2014/0218109 | A1 | 8/2014 | Wimpenny | |
| 2017/0194915 | A1 | 7/2017 | Wimpenny | |
| 2018/0076772 | A1* | 3/2018 | Khesbak | H03G 1/0029 |
| 2018/0109245 | A1* | 4/2018 | Takagi | H03K 5/06 |
| 2019/0006991 | A1* | 1/2019 | Marques | H03B 5/366 |
| 2019/0044480 | A1 | 2/2019 | Khlat | |
| 2020/0136563 | A1 | 4/2020 | Khlat | |
| 2020/0259685 | A1 | 8/2020 | Khlat | |
| 2020/0266766 | A1 | 8/2020 | Khlat et al. | |
| 2020/0336105 | A1 | 10/2020 | Khlat | |
| 2020/0336111 | A1 | 10/2020 | Khlat | |
| 2021/0211108 | A1 | 7/2021 | Khlat | |

FOREIGN PATENT DOCUMENTS

| | | | | | |
|---|---|---|---|---|---|
| JP | 2000216640 | A * | 8/2000 | H03F 1/3282 |
| JP | 3941107 | B2 * | 7/2007 | |
| TW | 201722069 | A * | 6/2017 | G05F 1/575 |
| WO | WO-9828943 | A1 * | 7/1998 | H04R 25/356 |

OTHER PUBLICATIONS

Notice of Allowance for U.S. Appl. No. 16/590,790, mailed Jan. 27, 2021, 7 pages.

International Search Report and Written Opinion for International Patent Application No. PCT/US2021/051682, mailed Dec. 23, 2021, 18 pages.

Office Action for Taiwanese Patent Application No. 110142531, mailed Nov. 26, 2025, 18 pages.

Office Action for Taiwanese Patent Application No. 110142531, mailed Mar. 5, 2026, 32 pages.

* cited by examiner

PROGRESSIVE ENVELOPE TRACKING WITH DELAY COMPENSATION

RELATED APPLICATIONS

This application is a 35 USC 371 national phase filing of International Application No. PCT/US2021/051682, filed Sep. 23, 2021, which claims the benefit of U.S. provisional patent application Ser. No. 63/114,200, filed Nov. 16, 2020, the disclosures of which are incorporated herein by reference in their entireties.

FIELD OF THE DISCLOSURE

The technology of the disclosure relates generally to an envelope tracking (ET) radio frequency (RF) front-end circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal (s) in a millimeter wave (mmWave) RF spectrum that is typically above six gigahertz (6 GHz). Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) simultaneously from multiple antennas using such spatial multiplexing schemes as multiple-input multiple-output (MIMO) and RF beamforming. As such, the 5G-NR mobile communication device needs to employ multiple RF power amplifiers in an RF front-end module (FEM) to amplify the RF signal(s) before feeding to the multiple antennas.

Envelope tracking (ET) is a power management technique designed to improve operating efficiency of the RF power amplifiers. Specifically, the power amplifiers simultaneously amplify the RF signal(s) based on multiple ET voltages that track a time-variant power envelope of the RF signal(s). Understandably, the better the ET voltages can track the time-variant power envelope, the more efficient the power amplifier can operate.

When there are a low number of resource blocks in the FEM, a very robust ET circuit may be over-engineered and inefficient from a power usage perspective. Various ways to improve efficiency have been proposed including modulation of an offset voltage within a conditioning circuit that generates the control signal for the RF power amplifiers. Room remains for improvements in such offset voltage modulation.

SUMMARY

Embodiments of the disclosure relate to progressive envelope tracking (ET) with delay compensation. In an exemplary aspect, an ET integrated circuit (IC) (ETIC) is a progressive ETIC that switches between different driver amplifiers having different associated offset voltages based on a tracking signal (e.g., Vramp) from a baseband transceiver. To make sure that desired changes to the offset voltage occur contemporaneously with an input signal for the driver amplifiers, a delay may be added to the input signal for the driver amplifiers. By adding and controlling this delay to the input to the driver amplifiers, the changes to the offset voltage will track the changes to the input signal at the driver amplifiers and overall efficiency of the ETIC may be improved.

In one aspect, an ETIC is provided. The ETIC comprises an input configured to receive a vramp signal from a baseband transceiver. The ETIC also comprises a first driver amplifier coupled to a first offset capacitor and a first variable feedback circuit. The ETIC also comprises a second driver amplifier coupled to a second offset capacitor, the first variable feedback circuit, and a second variable delay circuit. The ETIC also comprises a controller circuit. The controller circuit is configured to switch between the first driver amplifier and the second driver amplifier. The controller circuit is also configured to adjust a first delay for a first path that extends from a node to the second driver amplifier through the second variable delay circuit to match a second delay for a second path that extends from the node to the second driver amplifier through the controller circuit.

In another aspect, a wireless device is provided. The wireless device comprises a baseband transceiver configured to produce a vramp signal. The wireless device also comprises an ETIC coupled to the baseband transceiver. The ETIC comprises an input configured to receive the vramp signal. The ETIC also comprises a first driver amplifier coupled to a first offset capacitor and a first variable feedback circuit. The ETIC also comprises a second driver amplifier coupled to a second offset capacitor, the first variable feedback circuit, and a second variable delay circuit. The ETIC also comprises a controller circuit. The controller circuit is configured to switch between the first driver amplifier and the second driver amplifier. The controller circuit is also configured to adjust a first delay for a first path that extends from a node to the second driver amplifier through the second variable delay circuit to match a second delay for a second path that extends from the node to the second driver amplifier through the controller circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
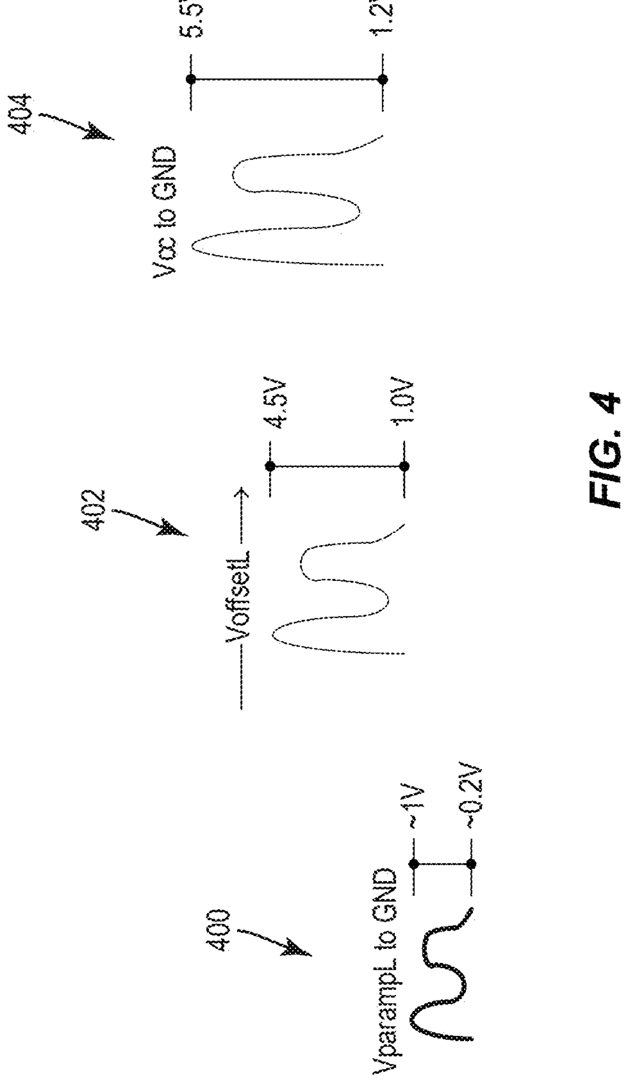
Figure 5:
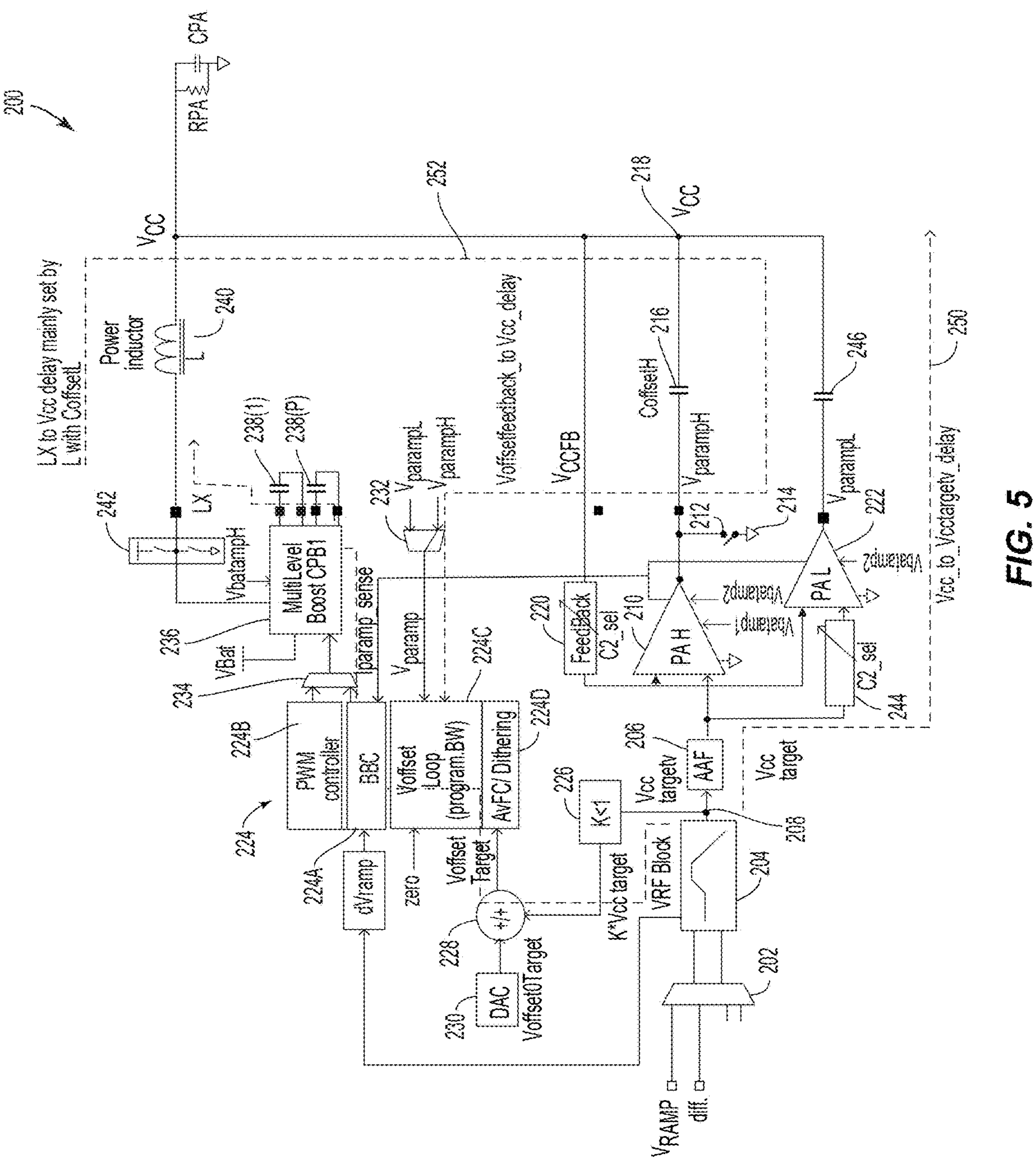

FIG. 4 provides a comparison of contributions to a Vcc control signal for an RF power amplifier from a driver amplifier and an offset voltage in a progressive ETIC; and FIG. 5 is a block diagram of a progressive ETIC that includes a delay element for a driver amplifier that causes changes in the input of the driver amplifier to align with changes in an offset voltage.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to progressive envelope tracking (ET) with delay compensation. In an exemplary aspect, an ET integrated circuit (IC) (ETIC) is a progressive ETIC that switches between different driver amplifiers having different associated offset voltages based on a tracking signal (e.g., Vramp) from a baseband transceiver. To make sure that desired changes to the offset voltage occur contemporaneously with an input signal for the driver amplifiers, a delay may be added to the input signal for the driver amplifiers. By adding and controlling this delay to the input to the driver amplifiers, the changes to the offset voltage will track the changes to the input signal at the driver amplifiers and overall efficiency of the ETIC may be improved.

Figure 1:
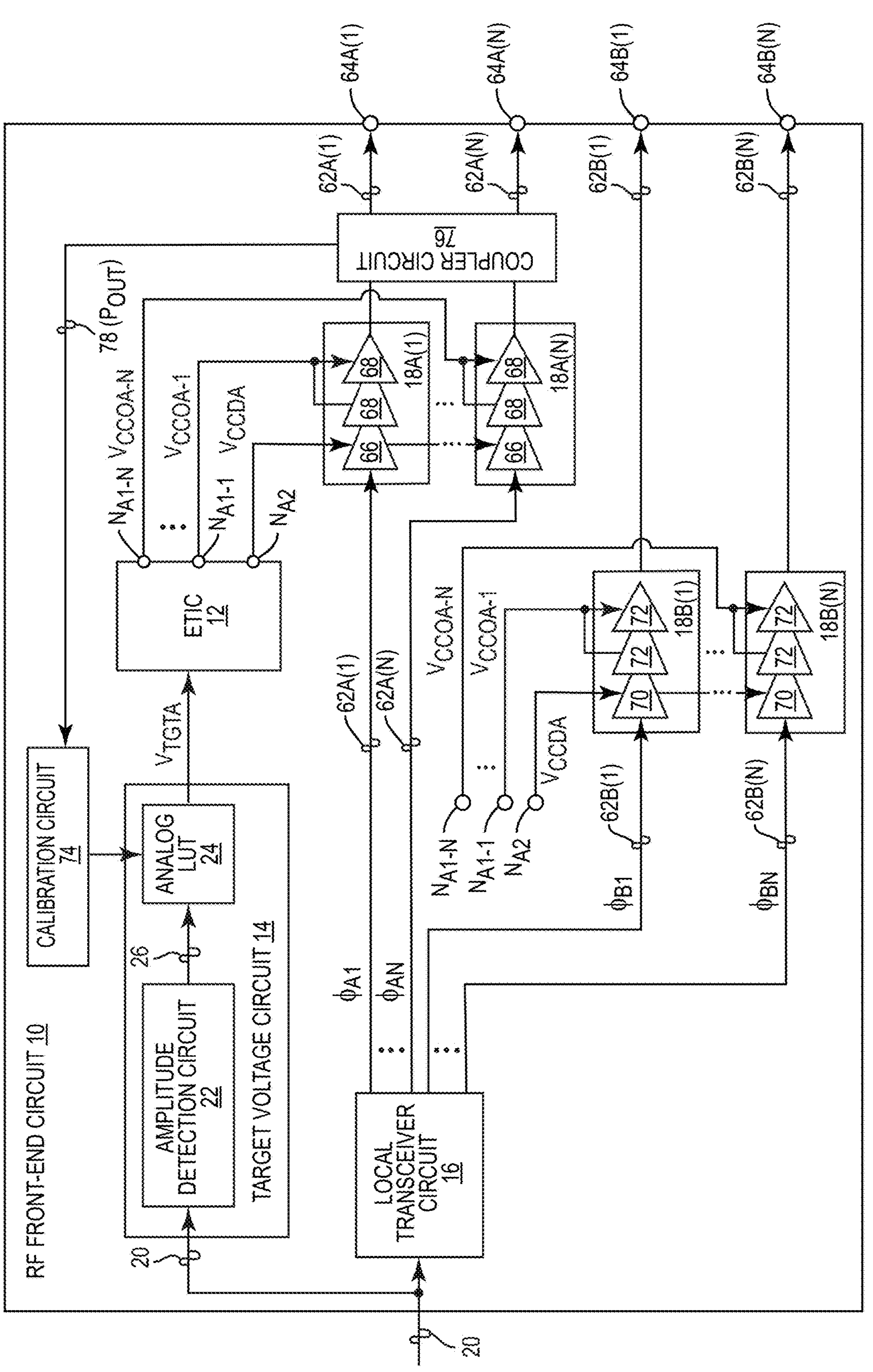
FIG. 1 is a schematic diagram of an exemplary envelope tracking (ET) radio frequency (RF) front-end circuit with power amplifier arrays controlled by an ET integrated circuit (IC) (ETIC)
Figure 2:
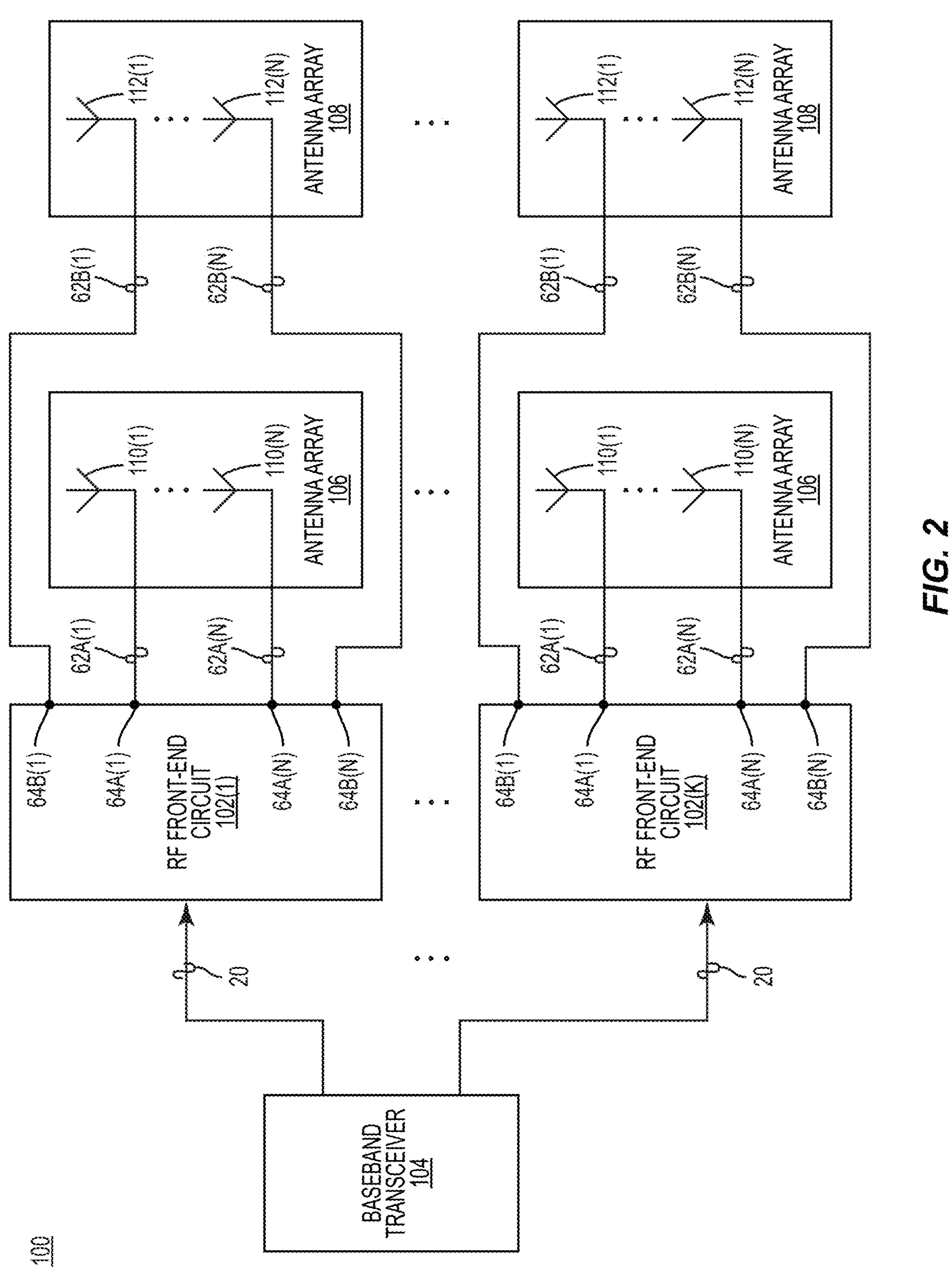
FIG. 2 is a schematic diagram of a wireless device including a number of the ET RF front-end circuits of FIG. 1.
Figure 3:
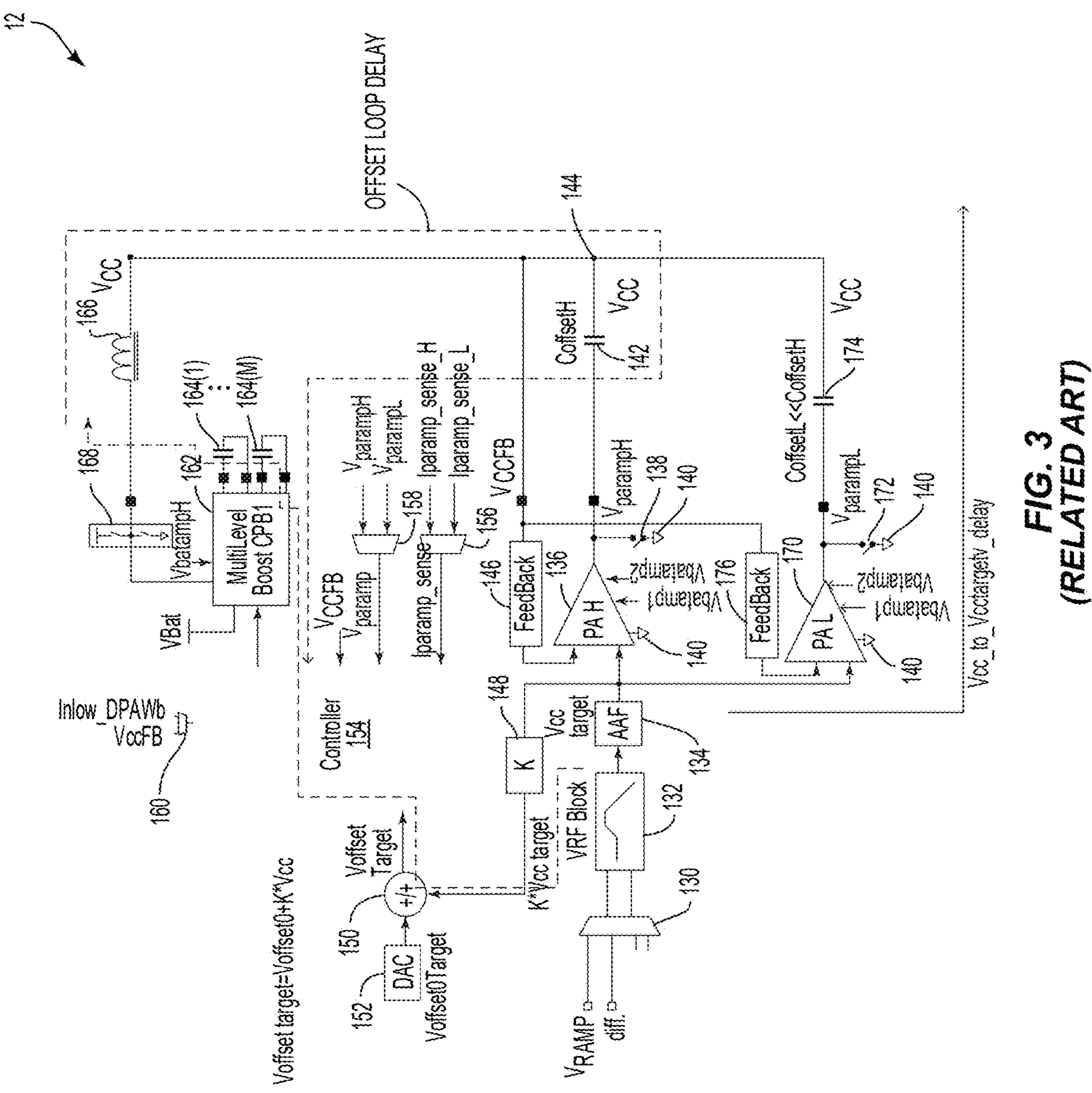
FIG. 3 is a block diagram of a progressive ETIC that switches between power amplifiers and offsets based on the input signal vramp while showing delay paths for signals affecting Vcc.

Before addressing particular aspects of the present disclosure, an overview of a transmitter with a radio frequency (RF) front end circuit is provided in FIGS. 1 and 2 with a discussion of a conventional progressive ETIC provided in FIGS. 3 and 4. A discussion of exemplary aspects of the present disclosure begins below with reference to FIG. 5.

In this regard, FIG. 1 is a schematic diagram of an exemplary ET RF front-end circuit 10 configured according to an aspect of the present disclosure. The ET RF front-end circuit 10 is self-contained in a system-on-chip (SoC) or system-in-package (SiP), as an example, to provide all essential functions of an RF front-end module (FEM). Specifically, the ET RF front-end circuit 10 is configured to include an ETIC 12, a target voltage circuit 14, a local transceiver circuit 16, and a number of power amplifiers 18A(1)-18A(N). The ET RF front-end circuit 10 may also include a number of second power amplifiers 18B(1)-18B(N). By packaging the ETIC 12, the target voltage circuit 14, the local transceiver circuit 16, the power amplifiers 18A(1)-18A(N), and the second power amplifiers 18B(1)-18B(N) into the ET RF front-end circuit 10, it is possible to reduce distance-related distortion in the aforementioned conventional implementation, thus helping to improve operating efficiency and linearity of the power amplifiers 18A(1)-18A(N), 18B(1)-18B(N).

The ETIC 12 is configured to generate a number of first ET voltages $V_{CCOA\text{-}1}$-$V_{CCOA\text{-}N}$ at a number of first output nodes $N_{A1\text{-}1}$-$N_{A1\text{-}N}$, respectively. The ETIC 12 is also configured to generate a second ET voltage $V_{CCDA}$ at a second output node $N_{A2}$. The ETIC 12 generates both the first ET voltages $V_{CCOA\text{-}1}$-$V_{CCOA\text{-}N}$ and the second ET voltage $V_{CCDA}$ based on a time-variant ET target voltage $V_{TGTA}$, also sometimes referred to as Vramp. For a detailed description on specific embodiments of the ETIC 12 that generate the first ET voltages $V_{CCOA-1}$-$V_{CCOA-N}$ and the second ET voltage $V_{CCDA}$ based on the time-variant ET target voltage $V_{TGTA}$, please refer to U.S. patent application Ser. No. 17/142,507, now U.S. Pat. No. 11,677,365, entitled "ENVELOPE TRACKING POWER MANAGEMENT APPARATUS INCORPORATING MULTIPLE POWER AMPLIFIERS."

The target voltage circuit 14 is configured to generate the time-variant ET target voltage $V_{TGTA}$ based on an input signal 20, which can be a modulated carrier signal at millimeter wave (mmWave) frequency, intermediate frequency (IF), or In-phase/Quadrature (I/Q) baseband frequency. In a non-limiting example, the target voltage circuit 14 includes an amplitude detection circuit 22 and an analog lookup table (LUT) 24. The amplitude detection circuit 22 is configured to detect a number of time-variant amplitudes 26 of the input signal 20, and the analog LUT 24 is configured to generate the time-variant ET target voltage $V_{TGTA}$ based on the time-variant amplitudes 26.

The local transceiver circuit 16 further produces RF signals 62A(1)-62A(N) and 62B(1)-62B(N) that are provided to the power amplifiers 18A(1)-18A(N), 18B(1)-18B(N), that are controlled by the various Vcc signals from the ETIC 12. The power amplifiers 18A(1)-18A(N) may include an array of amplifiers 66, 68 as is well understood. Likewise, the power amplifiers 18B(1)-18B(N) may include an array of amplifiers 70, 72 as is well understood. A coupler circuit 76 may be used to provide a feedback signal 78 to a calibration circuit 74, which helps the analog LUT 24 determine a correct $V_{TGTA}$.

One or more of the ET RF front-end circuit 10 of FIG. 1 can be provided in a wireless device (e.g., a smartphone) to help enhance RF performance and user experience. In this regard, FIG. 2 is a schematic diagram of a wireless device 100 that includes a number of ET RF front-end circuits 102(1)-102(K), which can be any of the ET RF front-end circuit 10 of FIG. 1. Common elements between FIGS. 1 and 2 are shown therein with common element numbers and will not be re-described herein.

The wireless device 100 includes a baseband transceiver 104 that is separated from any of the ET RF front-end circuits 102(1)-102(K). The baseband transceiver 104 is configured the generate the input signal 20.

Each of the ET RF front-end circuits 102(1)-102(K) is coupled to a first antenna array 106 and a second antenna array 108. The first antenna array 106 includes a number of first antennas 110(1)-110(N), each coupled to a respective one of antenna ports 64A(1)-64A(N) and configured to radiate a respective one of RF signals 62A(1)-62A(N) in a first polarization (e.g., horizontal polarization). The second antenna array 108 includes a number of second antennas 112(1)-112(N), each coupled to a respective one of second antenna ports 64B(1)-64B(N) and configured to radiate a respective one of second RF signals 62B(1)-62B(N) in a second polarization (e.g., vertical polarization).

The ET RF front-end circuits 102(1)-102(K) may be disposed in different locations in the wireless device 100 to help enhance RF performance and improve user experience. For example, some of the ET RF front-end circuits 102(1)-102(K) may be provided on a top edge of the wireless device 100, while some of the ET RF front-end circuits 102(1)-102(K) are provided on a bottom edge of the wireless device 100.

It should be appreciated that the ET RF front-end circuits are used to improve efficiency for the main power amplifier arrays used to transmit the signals. That is, by providing 'just enough' voltage Vcc to the power amplifiers at the times when the power amplifiers need the voltage, the power amplifiers do not 'waste' unneeded power from worst case, static Vcc levels. For example, if the power amplifier only needs three volts (3 V) to boost the transmit signal to a desired level, but Vcc is 5 V, the power amplifier has been provided excess voltage which is unused and wasted. By using ET, Vcc is controlled and the efficiency of the power amplifiers is improved.

While using ET does improve the efficiency of the system by improving the efficiency of the power amplifiers, the ETIC may introduce some inefficiencies. To assist in battery management for mobile computing devices, improving efficiency in the transceiver is generally considered desirable. One way to improve efficiency in the ETIC is through the use of progressive ET as better explained with reference to FIGS. 3 and 4.

In this regard, FIG. 3 is a block diagram of an ETIC 12 that uses progressive ET. A target voltage ($V_{TGTA}$ also referred to as Vramp) is provided to the ETIC 12 and received by a multiplexer 130. The target voltage may initially be a differential signal, but the multiplexer 130 may transform the signal to a single-ended signal if desired. The multiplexer 130 may be coupled to a bandpass filter 132, which blocks the signal at undesired frequencies. The bandpass filter 132 is coupled to an anti-aliasing filter (AAF) 134 which produces Vcc target. The Vcc target is provided to a first driver amplifier 136 (sometimes referred to as a horizontal amplifier H). The output of the first driver amplifier 136 may be coupled through a switch 138 to a ground 140. When the switch 138 is open (i.e., not grounded), the first driver amplifier 136 outputs an amplified signal $V_{parampH}$ and is coupled to a first offset capacitor 142. The first offset capacitor 142 also acts as a direct current (DC) block, allowing only alternating current (AC) signals to pass through. The first offset capacitor 142 is coupled to an output node 144. The first offset capacitor 142 may be reasonably large, for example, on the order of two to three microfarads. A control signal Vcc is available at the output node 144. The output node 144 is also coupled to a first feedback circuit 146, which is coupled to the first driver amplifier 136. The control signal Vcc is analogous to signals $V_{CCOA-1}$-$V_{CCOA-N}$ of FIG. 1.

With continued reference to FIG. 3, the bandpass filter 132 is also coupled to a multiplier 148 which multiplies Vcc target by a factor K, where $0<K<1$. K determines what percentage of Vcc is derived from the first driver amplifier 136 relative to the voltage provided at the first offset capacitor 142 as better explained below. The value K*Vcc target is provided to an adder 150, which adds K*Vcc target with a signal Voffset0Target from a digital-to-analog converter (DAC) 152 to form a signal Voffset Target. The adder 150 is coupled to a controller circuit 154. The controller circuit 154 has additional inputs from multiplexers 156, 158, 160 and provides an output to a multilevel boost charge pump 162. The multilevel boost charge pump 162 may use one or more capacitors 164(1)-164(M) to provide different levels of charge boost. The multilevel boost charge pump 162 may be connected to a voltage source such as Vbat. The multilevel boost charge pump 162 may also receive a signal $V_{batampH}$ (voltage battery amplifier horizontal) and a feedback signal Vccfb from the output node 144. The multilevel boost charge pump 162 may be coupled to a power inductor 166 through a switching circuit 168. The power inductor 166 is coupled to the output node 144 to provide a base DC power level (albeit with some ripple) at the output node 144. The multiplexer 158 receives and selects between voltage signals $V_{parampH}$ and $V_{parampL}$. The multiplexer 160 receives and selects between current signals $I_{paramp\_sense\_H}$ and $I_{paramp\_sense\_L}$. The respective voltage and current values may be manipulated within the controller circuit 154 to help estimate a load seen by the output node 144.

With continued reference to FIG. 3, the AAF 134 is also coupled to a second driver amplifier 170 (sometimes referred to as the vertical amplifier, although L is used because V might be confused for voltage). The second driver amplifier 170 includes an output that is coupled to ground 140 through a switch 172. When the switch 172 is open (e.g., not grounded), the second driver amplifier 170 produces a signal $V_{parampL}$. In use, only one switch 138 or 172 will be open at a time. The second driver amplifier 170 is coupled to a second offset capacitor 174, which is coupled to the output node 144. The output node 144 is also coupled to a second feedback circuit 176, which is coupled to an input of the second driver amplifier 170. The second offset capacitor 174 is relatively smaller than the first offset capacitor 142, and may be, for example on the order of twenty to forty nanofarad and thus, $C_{offsetL} \ll C_{offsetH}$. The reduced capacitance of the second offset capacitor 174 may have some increase in the ripple voltage, but this can be offset by using a lower Vbatamp voltage. Both the first and second driver amplifiers 136, 170 receive input signals Vbatamp1 and Vbatamp2.

In operation, the controller circuit 154 uses the switches 138, 172 to control a signal path from the AAF 134 through one or the other of the driver amplifiers 136, 170 to the output node 144. It should be appreciated that Vcc at the output node 144 is the sum of an offset voltage created by the offset capacitors 142, 174 and the Vparamp from the respective driver amplifiers 136, 170. This sum is better illustrated in FIG. 4, where an output 400 of the second driver amplifier 170 is added to an offset voltage 402 from the second offset capacitor 174 to create Vcc signal 404. Thus, the differently-valued offset capacitors 142, 174 produce different offset voltages. Further, selection of a specific K allows the ratio of voltage provided by the driver amplifiers 136, 170 relative to the offset capacitors 142, 174 to be selected. A progressive ETIC 12 uses this difference to its advantage by switching between the driver amplifiers 136, 170 based on which is more efficient. For more detail on a progressive ETIC, the interested reader is directed to U.S. Pat. No. 11,018,627, which is hereby incorporated by reference in its entirety.

While the ability to tune Vcc by changing with the offset voltage helps with the efficiency of driving the power amplifiers 18A(1)-18A(N), 18B(1)-18B(N), this solution raises other issues. Specifically, the signal entering the AAF 134 drives both the driver amplifiers 136, 170 and is also provided to the controller circuit 154. As illustrated in FIG. 3, these two paths do not have the same length and thus have differing delays associated therewith. The delay through the driver amplifiers 136, 170 is shown as Vcc_to_Vcctargetv_delay in FIG. 3. Thus, changes in Vcc target from the bandpass filter 132 propagate fairly quickly to the output node 144 because only three elements (the AAF 134, the driver amplifier 136, 170 and the offset capacitor 142, 174) lie between the bandpass filter 132 and the output node 144. In contrast, an offset loop delay (shown in dotted lines in FIG. 3) goes through the multiplier 148, the adder 150, the controller circuit 154, the multilevel boost charge pump 162, the power inductor 166, and back to the controller circuit 154. The comparatively large number of elements through which this signal must pass before the switches 138, 172 are controlled means that the delay for the offset loop delay is substantially larger than the Vcc_to_Vcctargetv_delay. This difference means that the driver amplifier 136, 170 will be quite fast and will deliver most of the load current instead of the power inductor 166, resulting in degraded operation.

In the abstract, there are a variety of ways to align the delays between the two paths, although two primary classifications exist. The first classification of solutions is to increase the bandwidth for the slow path as much as possible to speed up the data exchange. This increase in speed may be done by using a baseband controller in place of or in addition to a pulse width modulated (PWM) controller for the controller circuit 154. While this approach may increase the bandwidth, such increases are not sufficient to offset the overall delay of the path. Alternatively, this increase in speed may be achieved by lowering the value of the power inductor 166. However, changes in the power inductor 166 have other ramifications in terms of ripple. Another alternative is to decrease the value of the second offset capacitor 174. Size constraints preclude the second offset capacitor 174 from being much less than the twenty to forty nanoFarads discussed above. Likewise, reducing the capacitance of the second offset capacitor 174 also has ripple ramifications. Another alternative is to increase the bandwidth within the controller circuit 154 by using a lower zero frequency for a loop filter. Again, this may decrease delay, but not enough. As still another option, the controller circuit 154 may try to use Vcc target instead of Vccfb to get a time advance equivalent of the Vccfb. However, since Vcc target is the target and not a feedback signal, this creates an open loop, which may not result in desired values. It should be appreciated that each of these possible ways to increase the bandwidth for the slow path comes with trade-offs, which under current design realities are unacceptable.

The second classification of solutions to align the delays is to reduce the bandwidth of the AAF 134 and the driver amplifier 136, 170. This approach proves to provide a more acceptable trade-off. Accordingly, exemplary aspects of the present disclosure provide time alignment between the paths by increasing a feedback capacitor and also adjusting the AAF to increase the delay from the bandpass filter to the driver amplifier. These changes also lower the output impedance for the amplifier and assist in ripple absorption. The feedback capacitor also acts like a pole in the driver amplifier transfer function.

In this regard, FIG. 5 illustrates a progressive ETIC 200. Much of the structure of the progressive ETIC 200 is identical to the structure of ETIC 12, with a few important modifications to provide delay compensation. A target voltage ($V_{TGTA}$ also referred to as Vramp) is provided to the ETIC 200 and received by a multiplexer 202. The target voltage may initially be a differential signal, but the multiplexer 202 may transform the signal to a single-ended signal if desired. The multiplexer 202 may be coupled to a bandpass filter 204, which blocks the signal at undesired frequencies. The bandpass filter 204 is coupled to an AAF 206 with a node 208 therebetween. Vcc target is present at the node 208, and the AAF 206 produces Vcc target. The Vcc target is provided to a first driver amplifier 210 (sometimes referred to as a horizontal amplifier H). The output of the first driver amplifier 210 may be coupled through a switch 212 to ground 214. When the switch 212 is open (i.e., not grounded), the first driver amplifier 210 outputs an amplified signal $V_{parampH}$ and is coupled to a first offset capacitor 216. The first offset capacitor 216 also acts as a DC block, allowing only AC signals to pass through. The first offset capacitor 216 is coupled to an output node 218. The first offset capacitor 216 may be reasonably large, for example, on the order of two to three microfarads. A control signal Vcc is available at the output node 218. The output node 218 is also coupled to a first variable feedback circuit 220, which is coupled to the first driver amplifier 210 and to a second driver amplifier 222.

With continued reference to FIG. 5, the bandpass filter 204 provides a derivative of Vramp to a baseband controller (BBC) 224A portion of a controller 224 circuit. The controller circuit 224 may further include a PWM controller 224B, a Voffset loop controller 224C, which allows programming of a bandwidth, and a dithering circuit 224D. The bandpass filter 204 is also coupled to a multiplier 226 which multiplies Vcc target by a factor K, where 0<K<1. K determines what percentage of Vcc is derived from the driver amplifier 210 or 222 relative to the voltage provided at the first offset capacitor 216 as better explained below. The value K*Vcc target is provided to an adder 228, which adds K*Vcc target with a signal Voffset0Target from a DAC 230 to form a signal Voffset Target. The value from the DAC 230 is a DC offset value. The adder 228 is coupled to the dithering circuit 224D of the controller circuit 224. The controller circuit 224 has additional inputs from a multiplexer 232 that selects between $V_{parampH}$ from the first driver amplifier 210 and $V_{parampL}$ from the second driver amplifier 222. The controller circuit 224 also receives a sensed current signal Iparamp_sense from the driver amplifiers 210, 222. The PWM controller 224B and the BBC 224A output signals that are selected by a multiplexer 234. The output of the multiplexer 234 is coupled to a multilevel boost charge pump 236. The multilevel boost charge pump 236 may use one or more capacitors 238(1)-238(P) to provide different levels of charge boost. The multilevel boost charge pump 236 may be coupled to a voltage source such as Vbat. The multilevel boost charge pump 236 may also receive a signal $V_{batampH}$ (voltage battery amplifier horizontal). The multilevel boost charge pump 236 may be coupled to a power inductor 240 through a switching circuit 242. The power inductor 240 is coupled to the output node 218 to provide a base DC power level at the output node 218. The voltage and current values may be manipulated within the controller circuit 224 to help estimate a load seen by the output node 218.

With continued reference to FIG. 5, the AAF 206 is also coupled to a second variable delay circuit 244, which in turn is coupled to the second driver amplifier 222 (sometimes referred to as the vertical amplifier, although L is used because V might be confused for voltage). The second driver amplifier 222 produces the signal $V_{parampL}$. While not shown, there may be a switch that couples the output of the second driver amplifier 222 to ground (analogous to the switch 172 in FIG. 3). As with the ETIC 12, these switches are used to toggle between the driver amplifiers 210, 222 as desired. The second driver amplifier 222 is coupled to a second offset capacitor 246, which is coupled to the output node 218. The second offset capacitor 246 is relatively smaller than the first offset capacitor 216, and may be, for example on the order of twenty to forty nanofarad and thus, $C_{offsetL} << C_{offsetH}$. Delay paths 250, 252 are illustrated in FIG. 5 as well. As previously explained, it is these different delay paths 250, 252 which may create misalignment of control signals at the driver amplifier 222.

Exemplary aspects of the present disclosure control the AAF 206 and the second variable delay circuit 244 to control the delay of the Vcc_toVcctargetv_delay delay path 250. Specifically, the controller circuit 224 may store, such as in a lookup table or the like, a modification to the second variable delay feedback circuit 244 based on frequency, voltage level, and/or other parameters. Then, when the controller circuit 224 receives the dVramp signal, the controller circuit 224 may send a signal to the second variable delay circuit 244 to adjust one or more delay elements within the second variable delay circuit 244 to cause the delay between the node 208 and the input of the second driver amplifier 222 (i.e., path 250) to be equal to the delay between the node 208 and the change signal that causes the second offset capacitor 246 to be used (i.e., path 252). Note further that the controller circuit 224 may also adjust the AAF 206 to introduce delay in path 250.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (IC) (ETIC) comprising:
- an input configured to receive a vramp signal from a baseband transceiver;
- a first driver amplifier coupled to a first offset capacitor and a first variable feedback circuit;
- a second driver amplifier coupled to a second offset capacitor, the first variable feedback circuit, and a second variable delay circuit; and
- a controller circuit configured to:
  - switch between the first driver amplifier and the second driver amplifier; and
  - adjust a first delay for a first path that extends from a node to the second driver amplifier through the second variable delay circuit to match a second delay for a second path that extends from the node to the second driver amplifier through the controller circuit.

2. The ETIC of claim 1, wherein the first offset capacitor is coupled to an output node.

3. The ETIC of claim 2, wherein the second offset capacitor is coupled to the output node, and wherein the second offset capacitor is serially positioned between the second driver amplifier and the output node.

4. The ETIC of claim 1, further comprising a bandpass filter coupled to the input and the node.

5. The ETIC of claim 1, further comprising an anti-aliasing filter (AAF) coupled to the node and the first driver amplifier.

6. The ETIC of claim 1, wherein the second offset capacitor is smaller than the first offset capacitor.

7. The ETIC of claim 1, wherein the controller circuit is configured to adjust
- the first delay by adjusting the second variable delay circuit to increase a delay.

8. The ETIC of claim 5, wherein the controller circuit is configured to adjust the first delay by adjusting the AAF to increase a delay.

9. The ETIC of claim 1, further comprising a switch that selectively couples the first driver amplifier to ground, wherein the controller circuit is configured to operate the switch to switch between the first driver amplifier and the second driver amplifier.

10. The ETIC of claim 1, further comprising a scaling circuit coupled to the node.

11. A wireless device comprising:
- a baseband transceiver configured to produce a vramp signal;
- an envelope tracking (ET) integrated circuit (IC) (ETIC) coupled to the baseband transceiver, the ETIC comprising:
  - an input configured to receive the vramp signal;

a first driver amplifier coupled to a first offset capacitor and a first variable feedback circuit;

a second driver amplifier coupled to a second offset capacitor, the first variable feedback circuit, and a second variable delay circuit; and a controller circuit configured to:

switch between the first driver amplifier and the second driver amplifier; and adjust a first delay for a first path that extends from a node to the second driver amplifier through the second variable delay circuit to match a second delay for a second path that extends from the node to the second driver amplifier through the controller circuit.

12. The wireless device of claim 11, wherein the first offset capacitor is coupled to an output node.

13. The wireless device of claim 12, wherein the second offset capacitor is coupled to the output node.

14. The wireless device of claim 13, further comprising a power amplifier coupled to the output node.

15. The wireless device of claim 11, further comprising an anti-aliasing filter (AAF) coupled to the node and the first driver amplifier.

16. The wireless device of claim 11, wherein the controller circuit is configured to adjust the first delay by adjusting the second variable delay circuit to increase a delay.

17. The wireless device of claim 15, wherein the controller circuit is configured to adjust the first delay by adjusting the AAF to increase a delay.

18. The wireless device of claim 11, further comprising a switch that selectively couples the first driver amplifier to ground, wherein the controller circuit is configured to operate the switch to switch between the first driver amplifier and the second driver amplifier.

* * * * *